(12) United States Patent
Kurita et al.

(10) Patent No.: US 10,396,060 B2
(45) Date of Patent: Aug. 27, 2019

(54) SEMICONDUCTOR DEVICE AND METHOD FOR MANUFACTURING SAME

(71) Applicant: KABUSHIKI KAISHA TOSHIBA, Tokyo (JP)

(72) Inventors: Yoichiro Kurita, Tokyo (JP); Hideto Furuyama, Kanagawa (JP); Hiroshi Uemura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/904,201

(22) Filed: Feb. 23, 2018

(65) Prior Publication Data

US 2019/0157252 A1   May 23, 2019

(30) Foreign Application Priority Data

Nov. 17, 2017   (JP) .................................. 2017-221820

(51) Int. Cl.
*H01L 25/16* (2006.01)
*H01L 31/02* (2006.01)
(Continued)

(52) U.S. Cl.
CPC .......... *H01L 25/167* (2013.01); *H01L 21/565* (2013.01); *H01L 24/20* (2013.01);
(Continued)

(58) Field of Classification Search
None
See application file for complete search history.

(56) References Cited

U.S. PATENT DOCUMENTS

| 7,525,167 B2 | 4/2009 | Shizuno |
| 7,944,039 B2 | 5/2011 | Arai |

(Continued)

FOREIGN PATENT DOCUMENTS

| JP | 2004-165191 | 6/2004 |
| JP | 2004-319555 A | 11/2004 |

(Continued)

OTHER PUBLICATIONS

Doany et al.; "300-Gb/s 24-Channel Bidirectional Si Carrier Transceiver Optochip for Board-Level Interconnects", ECTC 2008, pp. 238-243.

*Primary Examiner* — Whitney Moore
(74) *Attorney, Agent, or Firm* — Finnegan, Henderson, Farabow, Garrett & Dunner, L.L.P.

(57) ABSTRACT

According to one embodiment, a semiconductor device includes an interconnect layer, an electrical element, an optical element, and a resin portion. The resin portion includes a first partial region between the electrical element and the optical element. At least a portion of the optical element does not overlap the resin portion in a first direction. The first partial region has first and second resin portion surfaces. The second resin portion surface is opposite to the first resin portion surface and opposes the interconnect layer. The optical element has first and second optical element surfaces. The second optical element surface is opposite to the first optical element surface and opposes the interconnect layer. A distance along the first direction between the interconnect layer and the first resin portion surface is longer than a distance along the first direction between the interconnect layer and the first optical element surface.

17 Claims, 9 Drawing Sheets

(51) Int. Cl.
  *H01L 23/00*  (2006.01)
  *H01L 21/56*  (2006.01)
  *H01L 33/62*  (2010.01)
  *G02B 6/42*   (2006.01)

(52) U.S. Cl.
  CPC ...... *H01L 25/165* (2013.01); *H01L 31/02005*
    (2013.01); *H01L 33/62* (2013.01); ***G02B
    6/4206* (2013.01); *G02B 6/4246*** (2013.01);
    *H01L 2224/214* (2013.01); *H01L 2924/1033*
    (2013.01); *H01L 2924/12041* (2013.01); *H01L
    2924/12042* (2013.01); *H01L 2924/12043*
    (2013.01); *H01L 2924/1424* (2013.01); *H01L
    2924/1431* (2013.01); *H01L 2924/1434*
                                           (2013.01)

(56)            References Cited

U.S. PATENT DOCUMENTS

| | | |
|---|---|---|
| 2009/0020839 A1 | 1/2009 | Furuyama |
| 2013/0056844 A1* | 3/2013 | Oganesian ........ H01L 27/14618 |
| | | 257/443 |
| 2016/0233396 A1* | 8/2016 | Ota ......................... H01L 33/56 |
| 2017/0153401 A1 | 6/2017 | Kurita et al. |

FOREIGN PATENT DOCUMENTS

| | | |
|---|---|---|
| JP | 2009-16707 | 1/2009 |
| JP | 2009-252859 | 10/2009 |
| JP | 2010-72350 A | 4/2010 |
| JP | 2013-110213 | 6/2013 |
| JP | 5446623 | 1/2014 |
| JP | 2017-102208 | 6/2017 |

\* cited by examiner

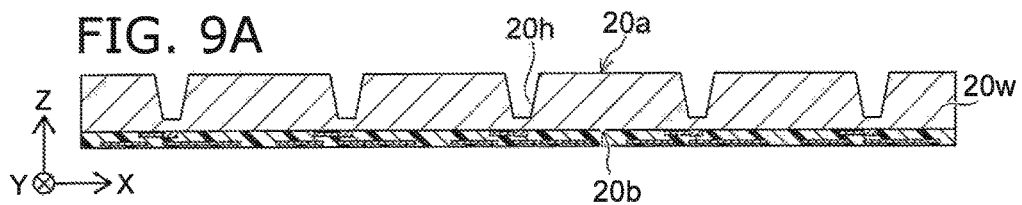
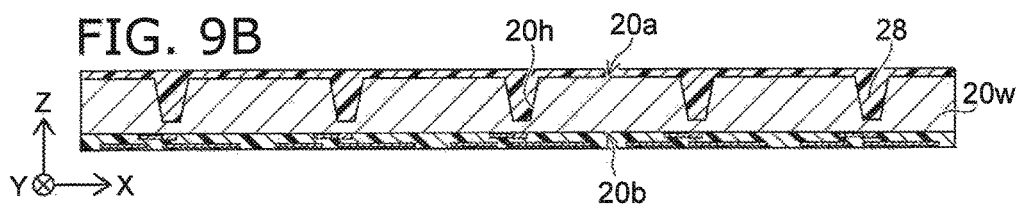
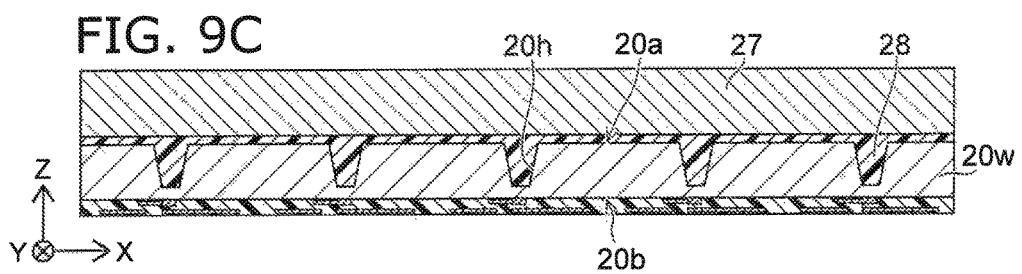
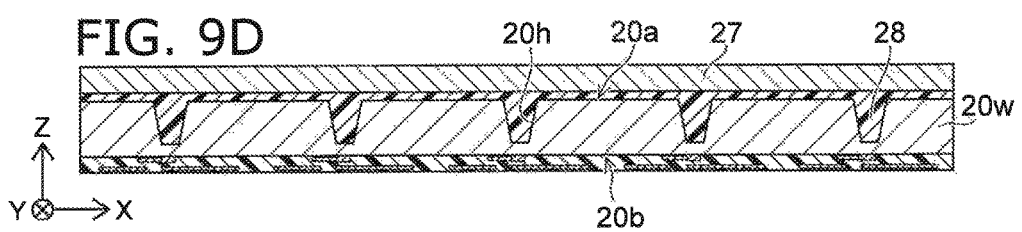
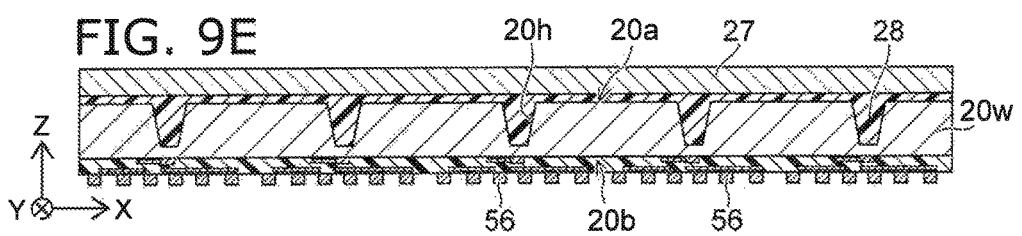
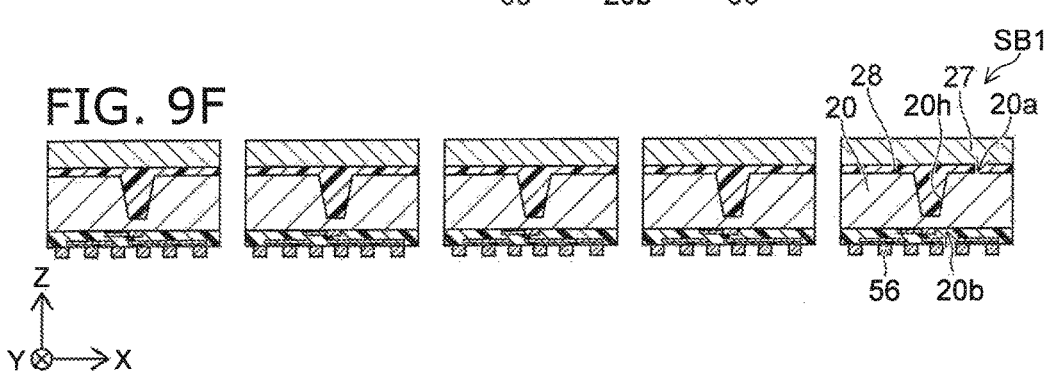

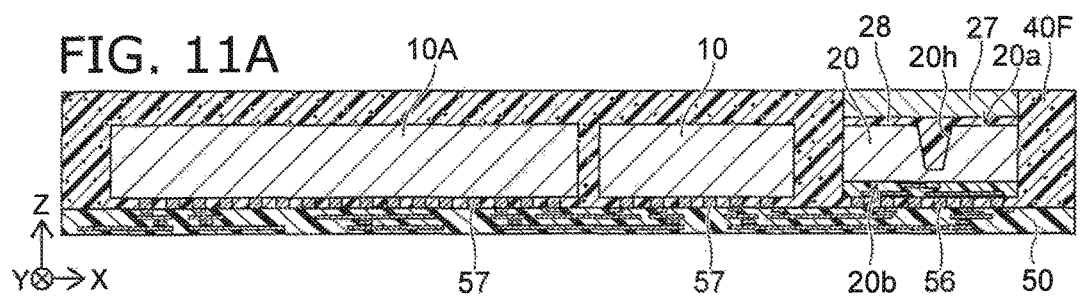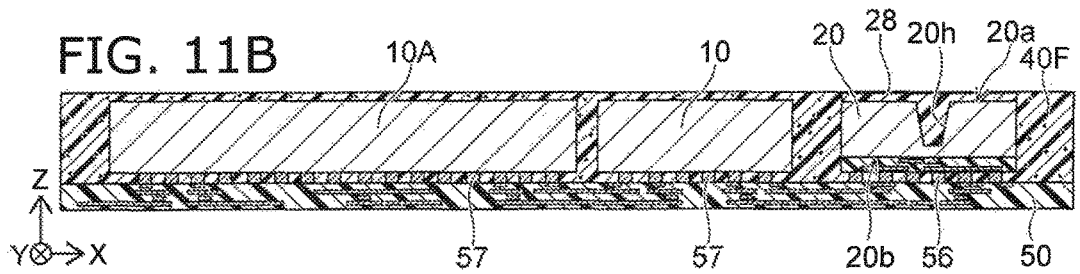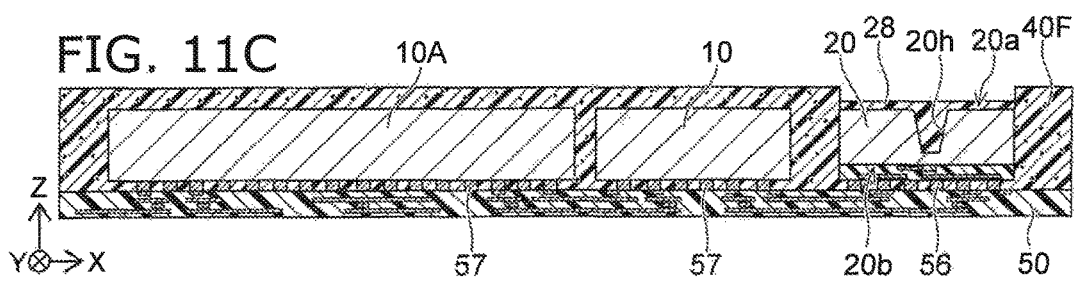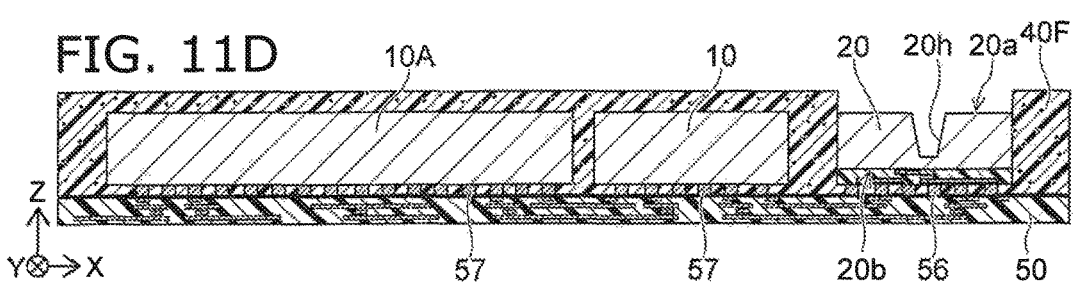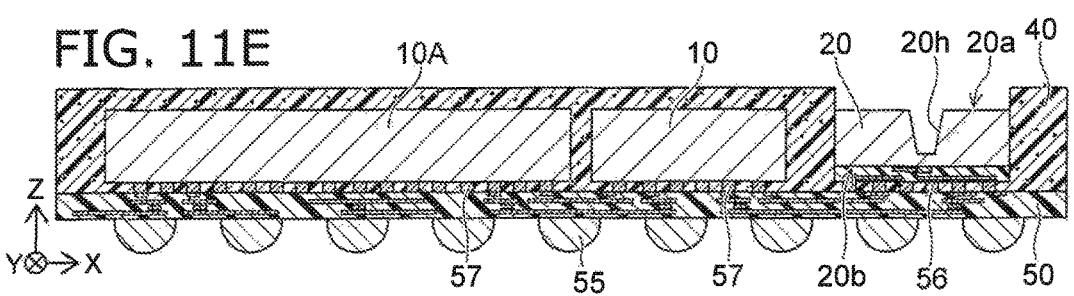

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2017-221820, filed on Nov. 17, 2017; the entire contents of which are incorporated herein by reference.

FIELD

Embodiments described herein relate generally to a semiconductor device and a method for manufacturing the same.

BACKGROUND

For example, there is a semiconductor device in which a semiconductor chip or the like is covered with a mold resin. It is desirable to downsize the semiconductor device.

BRIEF DESCRIPTION OF THE DRAWINGS

FIGS. 9A to 9F are schematic cross-sectional views illustrating another method for manufacturing the semiconductor device according to the second embodiment;

FIGS. 11A to 11E are schematic cross-sectional views illustrating another method for manufacturing the semiconductor device according to the second embodiment.

DETAILED DESCRIPTION

Figure 1A:
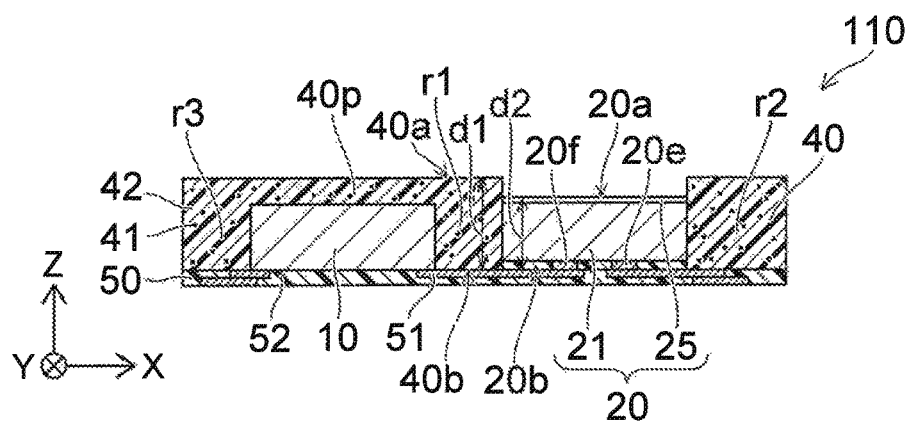
FIG. 1A to FIG. 1C are schematic views illustrating a semiconductor device according to a first embodiment.

According to one embodiment, a semiconductor device includes an interconnect layer, an electrical element, an optical element, and a resin portion. A direction from the interconnect layer toward the electrical element is a first direction. A direction from the interconnect layer toward the optical element is aligned with the first direction. A second direction from the electrical element toward the optical element crosses the first direction. The resin portion includes a first partial region. The first partial region is between the electrical element and the optical element. At least a portion of the optical element does not overlap the resin portion in the first direction. The first partial region has a first resin portion surface and a second resin portion surface. The second resin portion surface is opposite to the first resin portion surface and opposes the interconnect layer. The optical element has a first optical element surface and a second optical element surface. The second optical element surface is opposite to the first optical element surface and opposes the interconnect layer. A distance along the first direction between the interconnect layer and the first resin portion surface is longer than a distance along the first direction between the interconnect layer and the first optical element surface.

According to another embodiment, a method for manufacturing a semiconductor device is disclosed. The method can include covering a first structure body and an electrical element with a resin material layer. The first structure body includes an optical element and a first layer. The first layer is provided on the optical element. The method can include exposing the first layer by removing a portion of the resin material layer. The method can include removing the first layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
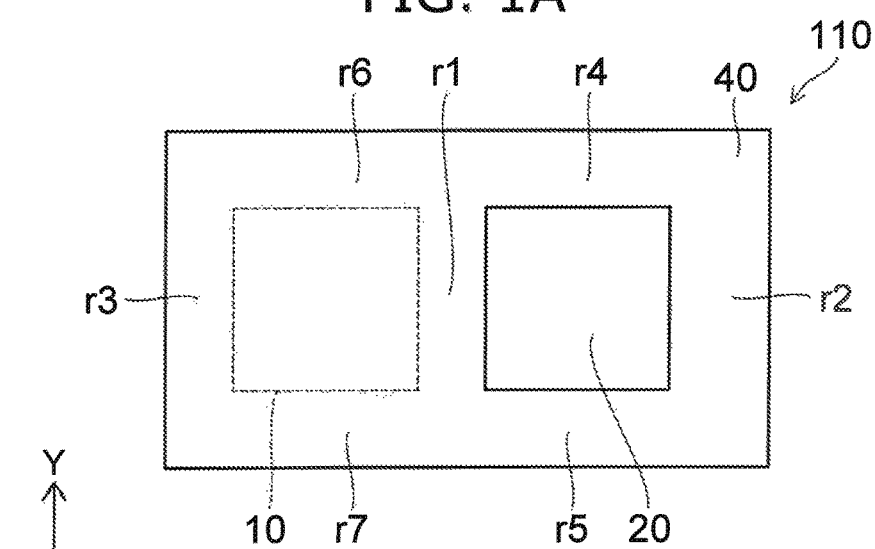
Figure 1C:
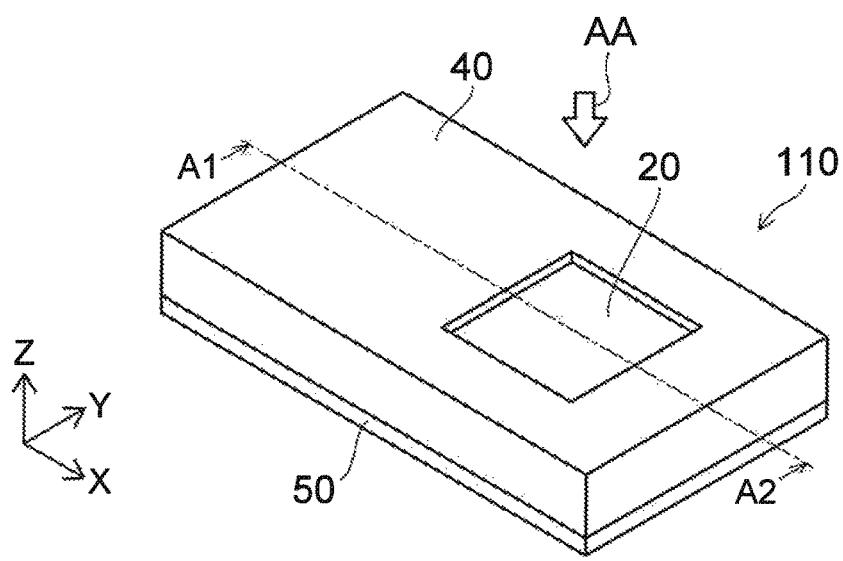

FIG. 1A to FIG. 1C are schematic views illustrating a semiconductor device according to a first embodiment. FIG. 1A is a line A1-A2 cross-sectional view of FIG. 1C. FIG. 1B is a plan view as viewed along arrow AA of FIG. 1C. FIG. 1C is a perspective view.

As shown in FIG. 1A, the semiconductor device 110 according to the first embodiment includes an interconnect layer 50, an electrical element 10 such as a semiconductor chip, an electronic component, etc., an optical element 20 such as an optical semiconductor chip (a light-emitting element, an optical modulator (an optical modulation element), a light receiving element), etc., and a resin portion 40.

The direction from the interconnect layer 50 toward the electrical element 10 is aligned with a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

For example, the interconnect layer 50 is aligned with the X-Y plane.

The direction from the interconnect layer 50 toward the optical element 20 is aligned with the first direction (the Z-axis direction). A second direction from the electrical element 10 toward the optical element 20 crosses the first direction. In the example, the second direction is aligned with the X-axis direction.

The resin portion 40 includes a first partial region r1. The first partial region r1 is positioned between the electrical element 10 and the optical element 20.

In the example as shown in FIG. 1B, the resin portion 40 further includes second to seventh regions r2 to r7.

The optical element 20 is positioned between the second partial region r2 and the first partial region r1 in the second direction (the X-axis direction). The electrical element 10 is positioned between the first partial region r1 and the third partial region r3 in the second direction.

The optical element 20 is positioned between the fourth partial region r4 and the fifth partial region r5 in the third direction. The third direction crosses a plane (e.g., the Z-X plane) including the first direction and the second direction. In the example, the third direction is the Y-axis direction. The electrical element 10 is positioned between the sixth partial region r6 and the seventh partial region r7 in the third direction.

The first to seventh partial regions r1 to r7 are continuous with each other. In the example, the direction from the fourth partial region r4 toward the sixth partial region r6 is aligned with the X-axis direction. The direction from the fifth partial region r5 toward the seventh partial region r7 is aligned with the X-axis direction.

The optical element 20 has a first optical element surface 20a and a second optical element surface 20b. The second optical element surface 20b opposes the interconnect layer 50 along the first direction (the Z-axis direction). The second optical element surface 20b is a surface that is opposite to the first optical element surface 20a. In one example, the first optical element surface 20a is a light-emitting surface (a light-emitting surface) of the optical element. In one other example, the first optical element surface 20a is a light incident surface (a light receiving surface) of the optical element.

For example, at least a portion of the first optical element surface 20a is not covered with the resin portion 40.

In the example, the upper surface of the optical element 20 is positioned lower than the upper surface of the resin portion 40.

The first partial region r1 of the resin portion 40 has a first resin portion surface 40a and a second resin portion surface 40b. The second resin portion surface 40b opposes the interconnect layer 50 along the first direction (the Z-axis direction). The second resin portion surface 40b is a surface that is opposite to the first resin portion surface 40a.

As shown in FIG. 1A, the distance along the first direction (the Z-axis direction) between the interconnect layer 50 and the first resin portion surface 40a is taken as a distance d1. The distance along the first direction between the interconnect layer 50 and the first optical element surface 20a is taken as a distance d2. The distance d1 is longer than the distance d2. The first optical element surface 20a is recessed further than the first resin portion surface 40a due to such a distance relationship. For example, at the first optical element surface 20a, dirt or the like is suppressed; and a good optical function is obtained.

Figure 12:
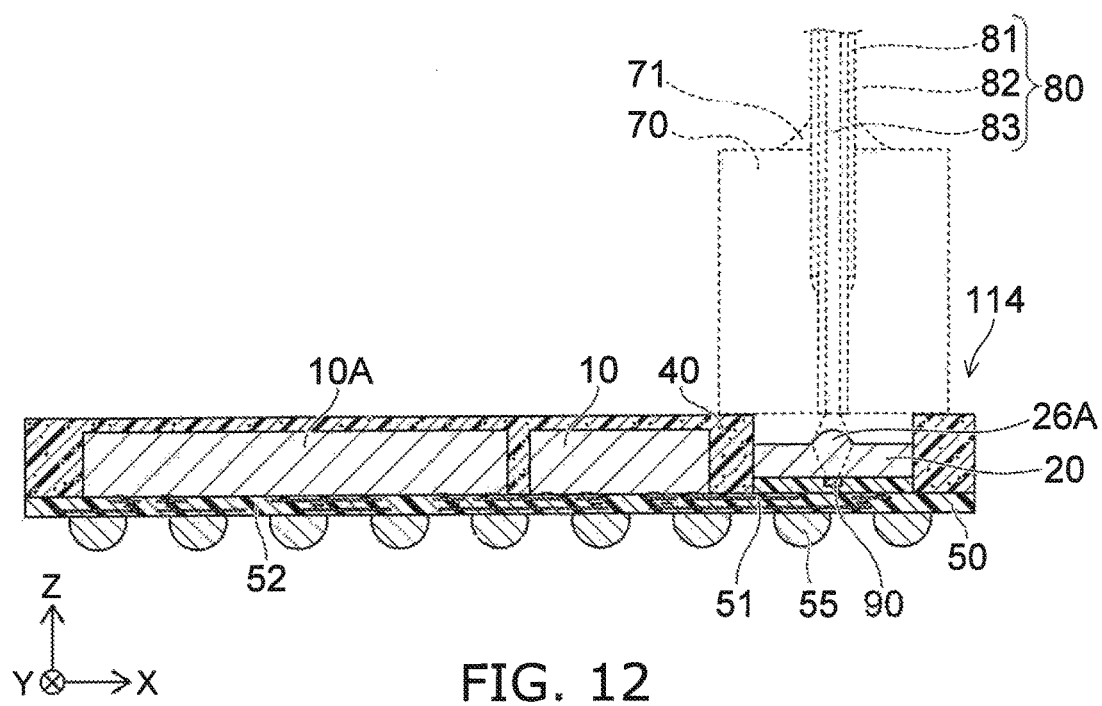
FIG. 12 is a schematic cross-sectional view illustrating an application of the semiconductor device according to the first embodiment.

For example, as shown in FIG. 12, in the case where optical coupling is performed by disposing an optical fiber 80 held by an optical connector ferrule 70 at the light input/output surface (light output or light input) of the optical element 20, etc., a configuration is possible in which the optical fiber does not contact the light input/output surface even when the optical fiber is set to be proximal to the optical element 20. In the example, the optical fiber 80 includes a UV resin 81, cladding 82, and a core 83. A bonding agent 71 is provided between the ferrule 70 and the optical fiber 80. The optical element 20 includes a crystal lens 26A. The refractive index of the crystal lens 26A is, for example, 3.2 to 3.5. A light emitter/light receiver 90 is provided between the interconnect layer 50 and the optical element 20.

In the description recited above, in the case where the optical fiber and the optical element 20 are fixed to be proximal to each other, even if the optical fiber tip juts out due to thermal expansion and/or stress due to a change of the environment of use (e.g., a stress change due to a temperature change or an external force), a configuration is possible in which the jutting is absorbed by the clearance preset between the first resin portion surface 40a and the first optical element surface 20a; and damage of the optical fiber and the optical element 20 is preventable.

Also, instead of an anti-reflection coating on the light input/output surface of the optical element 20, in the case where an uneven portion having a SWS (Sub-Wavelength Structure) is formed by etching, in the case where an uneven portion of a SWC (Sub-Wavelength Structure Coating) is formed using a material other than that of the optical element, etc., the loss of the effect of the anti-reflection coating due to foreign matter entering the uneven portion of the optical element 20 surface due to contact with the optical fiber, etc., can be prevented.

As shown in FIG. 12, in the case where the optical coupling is performed by forming an optical element such as a lens, etc., on the light input/output surface of the optical element 20, it is possible to set the distance between the optical element 20 and the optical fiber to a spacing that matches the lens focal point.

Also, the utilization as a distance adjustment mechanism to similarly match the lens focal point is possible even in the case where a diffractive lens, a Fresnel lens, or the like is formed in the surface of the optical element 20; and the loss of the lens function due to foreign matter entering the uneven portion of the diffractive lens or the Fresnel lens due to contact with the optical fiber, etc., can be prevented.

Figure 8:
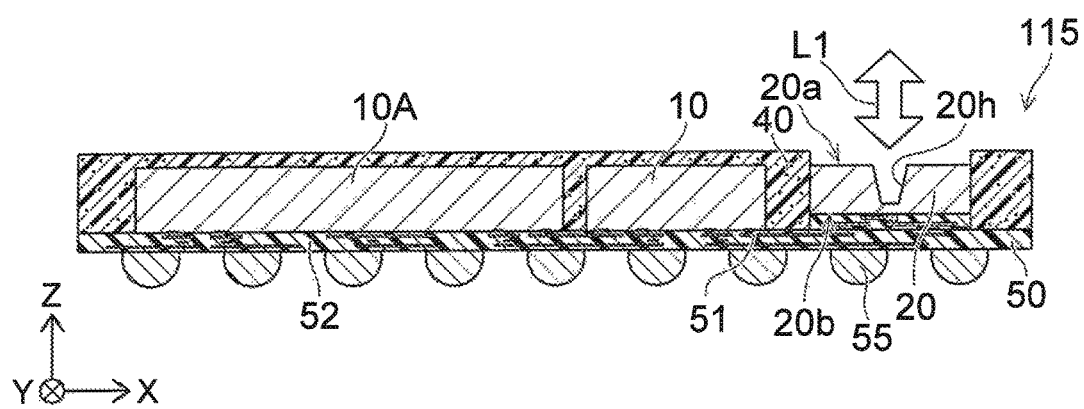
FIG. 8 is a schematic cross-sectional view illustrating another semiconductor device according to the first embodiment.

As shown in FIG. 8, for example, in the case where the optical fiber strand in which the cladding is exposed is inserted into the optical element 20 and a recess that holds the optical fiber strand is provided in the optical element 20, similarly to the description recited above, foreign matter can be prevented from entering the recess due to the contact of an unintended object before the insertion of the optical fiber strand. In such a case, the optical coupling with the optical fiber is ensured by, for example, setting the optical fiber to be a GI (Graded Index) fiber (multimode fiber) having a core diameter of 50 μm and a cladding diameter of 125 μm, and by setting the distance from the recess bottom surface of an optical element substrate 21 of the optical element 20 to the active portion (the light emitter, the light receiver, or the light modulator) formed in the interconnect layer side surface to be, for example, 50 μm or less.

For example, the electrical element 10 has a side surface. The side surface crosses the X-Y plane. The resin portion 40 is provided around the side surface of the electrical element 10. For example, the optical element 20 has a side surface. The side surface crosses the X-Y plane. The resin portion 40 is provided around the side surface of the optical element 20.

The electrical element 10 includes, for example, a semiconductor chip. For example, the electrical element 10 is made from an amplifier circuit, a logic circuit, a memory circuit, or a switching circuit and may include at least one of an arithmetic circuit, a control circuit, or a signal processing circuit. The electrical element 10 may include, for example, at least one of a resistor, a capacitor, or an inductor. Multiple electrical elements 10 may be provided in the embodiment. One of the multiple electrical elements 10 will now be described. The description recited below is applicable also to another one of the multiple electrical elements 10.

The electrical element 10 includes, for example, at least one of silicon, Ge, diamond, or a compound semiconductor (SIC, GaN, GaAs, InP, etc.).

The optical element 20 includes, for example, at least one of a light-emitting element or a light receiving element. The light-emitting element includes, for example, a light-emitting diode or a laser diode. The light receiving element includes, for example, a photodiode, an avalanche photodiode, or a MSM (Metal Semiconductor Metal) photodiode. The optical element 20 includes, for example, at least one of silicon, Ge, diamond, or a compound semiconductor (SiC, GaN, GaAs, InP, etc.). For example, the optical element 20 has the function of transmitting and receiving (communicating) a signal using light.

The interconnect layer 50 includes, for example, a conductive layer 51. The conductive layer 51 is, for example, a redistribution layer (Re-Distribution Layer (RDL)). For example, the conductive layer 51 is electrically connected to at least one of the optical element 20 or the electrical element 10. For example, the conductive layer 51 may be electrically connected to the optical element 20 and the electrical element 10.

For example, the optical element 20 includes electrodes (a first electrode 20e, a second electrode 20f, etc.). For example, the conductive layer 51 is electrically connected to at least one of the first electrode 20e or the second electrode 20f.

The interconnect layer 50 further includes a resin layer 52. The resin layer 52 includes, for example, a resin such as polyimide, etc.

For example, the first to seventh partial regions r1 to r7 of the resin portion 40 contact the interconnect layer 50.

In the embodiment, at least a portion of the optical element 20 does not overlap the resin portion 40 in the first direction (the Z-axis direction). Thereby, in the case where the optical element 20 includes a light-emitting element, the light that is emitted from the light-emitting element can be emitted to the outside without passing through the resin portion 40. On the other hand, in the case where the optical element 20 is a light receiving element, the light can be incident on the optical element 20 without passing through the resin portion 40. Thereby, good characteristics are obtained for at least one of the emission or the incidence of the light for the optical element 20.

In the semiconductor device 110, the electrical element and the optical element 20 are combined; and the interconnect layer 50 is provided. Such an electrical element 10 and such an optical element 20 are held by the resin portion 40. The number of parts is low. The size of the semiconductor device can be small; and connections having a small pitch (spacing) are possible. A good function of the optical element is obtained because at least a portion of the optical element 20 is not covered with the resin portion 40. A semiconductor device can be provided in which downsizing is possible while obtaining a good function.

In the example as shown in FIG. 1A, the electrical element 10 is positioned between the interconnect layer 50 and the portion 40p of the resin portion 40 in the first direction (the Z-axis direction). For example, the electrical element 10 is covered with the resin portion 40. Good reliability is obtained. As described below, at least a portion of the electrical element 10 may not be covered with the resin portion 40.

In the example, the optical element 20 includes the optical element substrate 21 (a transparent layer or an optical element semiconductor layer) and an antireflective layer 25 (an optical layer). The optical element substrate 21 is positioned between the antireflective layer 25 and the interconnect layer 50. For example, the optical element 20 that is provided on the optical element substrate 21 has the function of at least one of light emission or light reception. The refractive index of the antireflective layer 25 is lower than the refractive index of the optical element substrate 21. The refractive index of the antireflective layer 25 is, for example, greater than 1. Thereby, good reception/emission characteristics are obtained between the outside and the optical element substrate 21. The antireflective layer 25 has a reflection suppression function and may be made of a single layer or multilayer film. In the case where the antireflective layer 25 is a single-layer film, for example, the refractive index of the antireflective layer 25 is set to be about the square root of the product of the refractive index of the optical element substrate 21 and the refractive index of the medium on the outer side of the antireflective layer 25 (e.g., a gap having a refractive index of 1, a transparent resin having a refractive index of 1.5, etc.); and the thickness of the antireflective layer 25 is set to a thickness corresponding to an optical length (the wavelength/refractive index) of ¼ of the operating wavelength (the light emission wavelength or the light reception wavelength) of the optical element.

The refractive index recited above is the refractive index of the operation (light emission or light reception) wavelength of the optical element 20.

For example, the optical element 20 is configured to emit light. The refractive index of the antireflective layer 25 for the peak wavelength of the light is lower than the refractive index of the optical element substrate 21 for the peak wavelength. In such a case, the refractive index of the antireflective layer 25 is, for example, greater than 1.

For example, in the case where the optical element 20 is a light receiving element, the refractive index of the antireflective layer 25 for the peak wavelength of the light incident on the optical element 20 is lower than the refractive index of the optical element substrate 21 for the peak wavelength. In such a case, the refractive index of the antireflective layer 25 is, for example, greater than 1.

As described below, the antireflective layer 25 may be omitted.

In the embodiment, the resin portion 40 includes multiple particles 41 and a resin material portion 42. The resin material portion 42 is provided around at least a portion of the multiple particles 41. The multiple particles 41 include, for example, at least one of silicon oxide, aluminum oxide, silicon nitride, or aluminum nitride. For example, good heat dissipation is obtained. For example, a high mechanical strength is obtained. The resin material portion 42 includes, for example, at least one of an epoxy resin or a silicone resin.

Second Embodiment

An example of a method for manufacturing the semiconductor device 110 recited above will now be described as a second embodiment.

FIG. 2A to FIG. 2G are schematic cross-sectional views illustrating the method for manufacturing the semiconductor device according to the second embodiment.

Figure 2A:
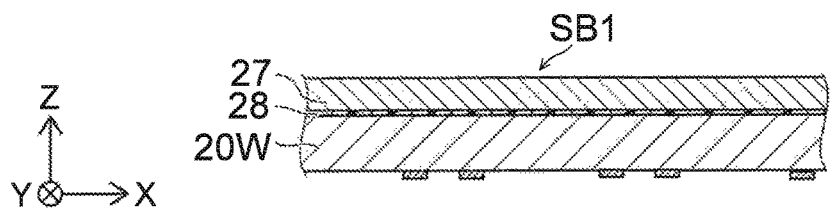
FIG. 2A to FIG. 2G are schematic cross-sectional views illustrating the method for manufacturing the semiconductor device according to the second embodiment.

A first structure body SB1 is prepared as shown in FIG. 2A. For example, a first layer 27 is fixed to a wafer 20W used to form the optical element 20. In the example, the first layer 27 is fixed to the wafer 20W by a bonding layer 28. The wafer 20W is, for example, a substrate (e.g., a silicon substrate) used to form the optical element 20. Multiple optical elements 20 are obtained from the wafer 20W. The first layer 27 is, for example, a thin silicon layer (substrate). The multiple first structure bodies SB1 are obtained by subdividing such a stacked body into multiple regions. One of the multiple first structure bodies SB1 will now be described.

Figure 2B:
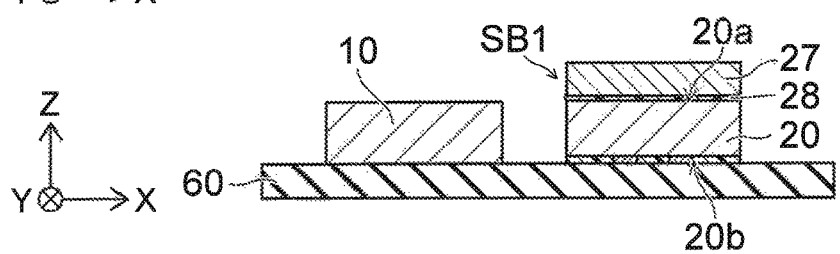

As shown in FIG. 2B, the first structure body SB1 and the electrical element 10 recited above are fixed to a support body 60. The support body 60 is, for example, silicon, glass, or a resin substrate. The first structure body SB1 includes the optical element 20, and the first layer 27 provided on the optical element 20.

In the optical element 20, the second optical element surface 20b opposes the support body 60. The first optical element surface 20a opposes the first layer 27 (in the example, the bonding layer 28).

Figure 2C:
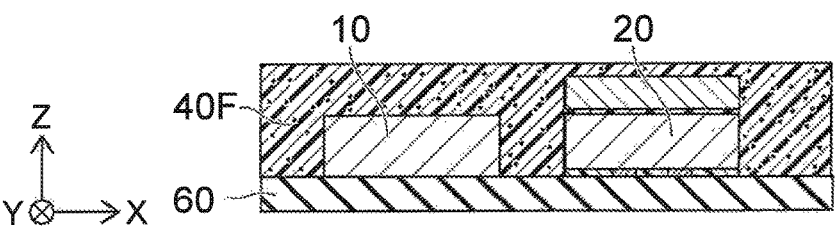

As shown in FIG. 2C, the first structure body SB1 and the electrical element 10 are covered with a resin material layer 40F. The resin material layer 40F is used to form the resin portion 40.

Figure 2D:
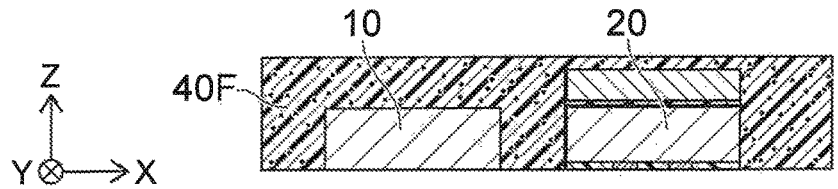

The support body 60 is removed as shown in FIG. 2D.

Figure 2E:
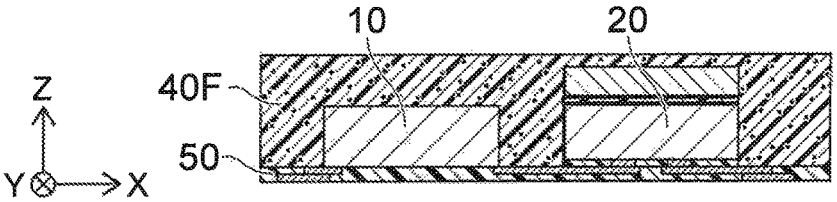

As shown in FIG. 2E, the interconnect layer 50 is formed on the first structure body SB1 and the electrical element 10 exposed by the removal of the support body 60.

Figure 2F:
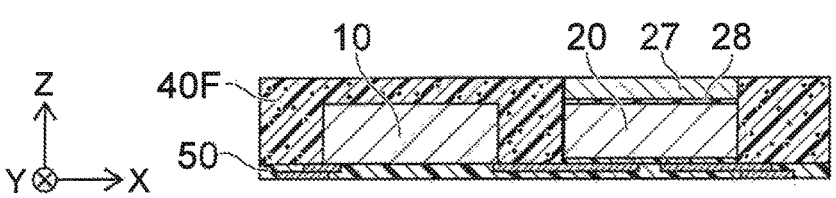

As shown in FIG. 2F, the first layer 27 is exposed by removing a portion of the resin material layer 40F. The removal includes, for example, performing CMP (chemical mechanical polishing), etc.

Figure 2G:
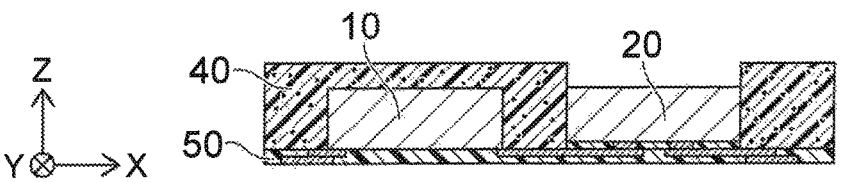

The first layer 27 is removed as shown in FIG. 2G. At this time, the bonding layer 28 also is removed. In the removal of the first layer 27, for example, the resin material layer 40F (at least a portion of the resin material layer 40F) remains. Thereby, the semiconductor device 110 is obtained.

Thus, in the example, the covering with the resin material layer 40F is performed in the state in which the first structure body SB1 and the electrical element 10 are fixed to the support body 60. Then, after the covering with the resin material layer 40F, the support body 60 is removed. The interconnect layer 50 is formed on the first structure body SB1 and the electrical element 10 exposed by the removal of the support body 60. The exposing of the first layer 27 is performed after the formation of the interconnect layer 50.

Another example of the method for manufacturing the semiconductor device will now be described.

FIG. 3A to FIG. 3D are schematic cross-sectional views illustrating another method for manufacturing the semiconductor device according to the second embodiment.

Figure 3A:
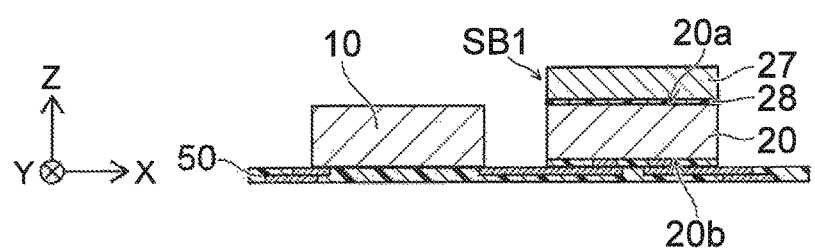
FIG. 3A to FIG. 3D are schematic cross-sectional views illustrating another method for manufacturing the semiconductor device according to the second embodiment.

As shown in FIG. 3A, the interconnect layer 50 is provided on the first structure body SB1 and the electrical element 10. The first structure body SB1 and the electrical element 10 are fixed to the interconnect layer 50.

Figure 3B:

As shown in FIG. 3B, the first structure body SB1 and the electrical element 10 are covered with the resin material layer 40F.

Figure 3C:
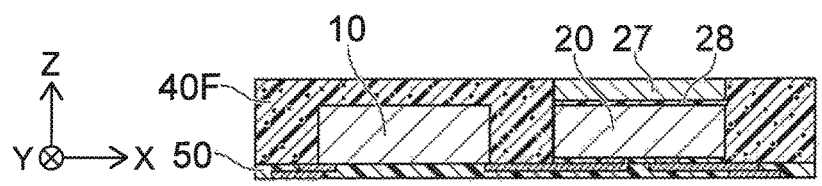

As shown in FIG. 3C, the first layer 27 is exposed by removing a portion of the resin material layer 40F.

Figure 3D:
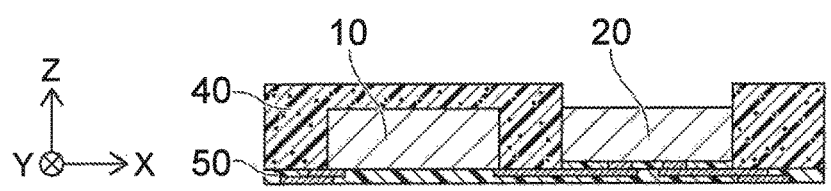

The first layer 27 is removed as shown in FIG. 3D.

Other examples of the semiconductor device according to the first embodiment will now be described.

FIG. 4 to FIG. 8 are schematic cross-sectional views illustrating other semiconductor devices according to the first embodiment.

Figure 4:
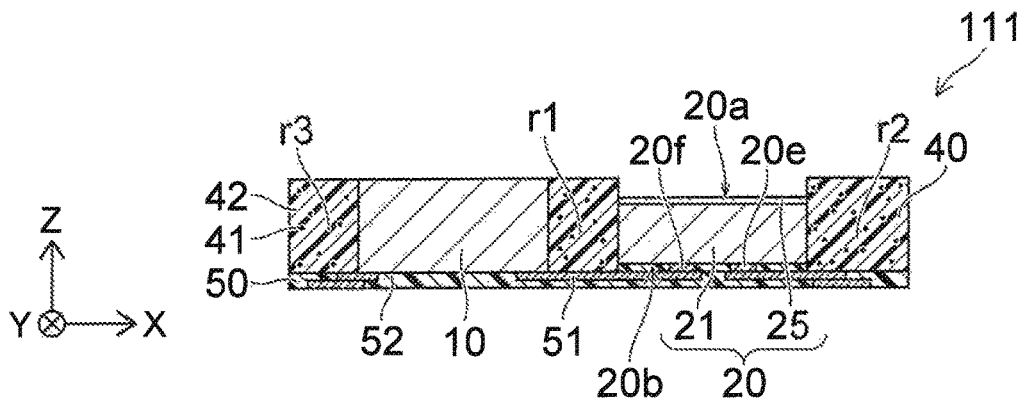
FIG. 4 is a schematic cross-sectional view illustrating another semiconductor device according to the first embodiment.

In a semiconductor device 111 as shown in FIG. 4, at least a portion of the electrical element 10 does not overlap the resin portion 40 in the first direction (the Z-axis direction). Otherwise, the configuration of the semiconductor device 111 is similar to that of the semiconductor device 110.

Figure 5:
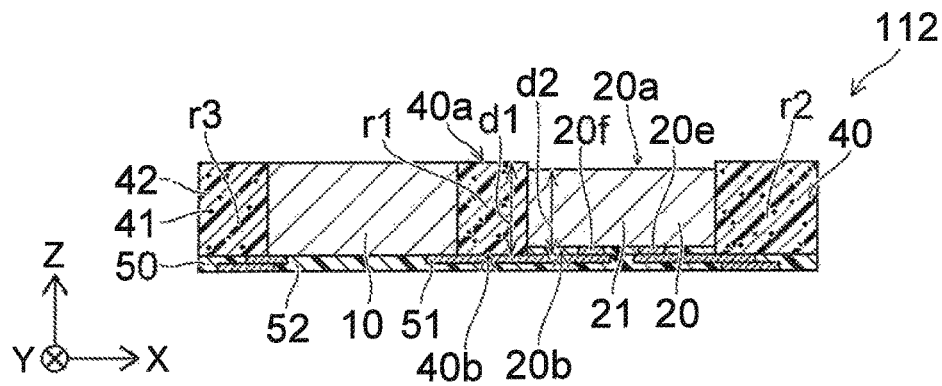
FIG. 5 is a schematic cross-sectional view illustrating another semiconductor device according to the first embodiment.

In a semiconductor device 112 as shown in FIG. 5, the antireflective layer 25 is not provided on the optical element 20. Otherwise, the configuration of the semiconductor device 112 is similar to that of the semiconductor device 110.

Figure 6:
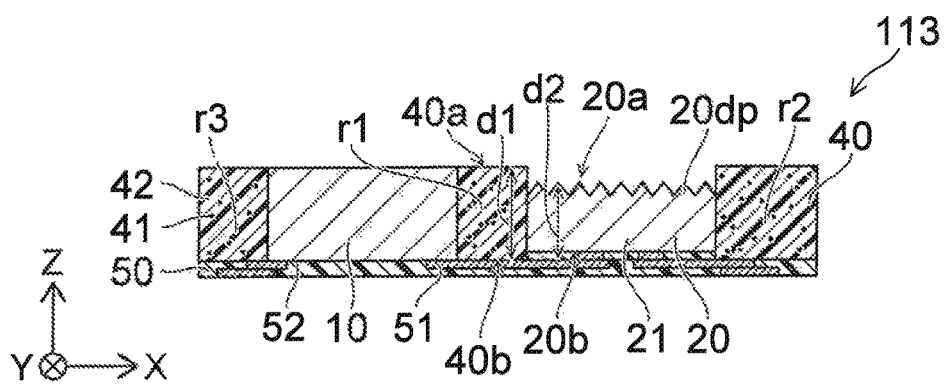
FIG. 6 is a schematic cross-sectional view illustrating another semiconductor device according to the first embodiment.

In a semiconductor device 113 as shown in FIG. 6, the antireflective layer 25 of the optical element 20 is omitted. In the semiconductor device 113, the first optical element surface 20a includes multiple unevennesses 20dp. The multiple unevennesses 20dp may be arranged at a period that is shorter than the light emission peak wavelength or the light reception peak wavelength of the optical element 20. The multiple unevennesses 20dp may be a diffractive lens or a Fresnel lens for the light emission peak wavelength or the light reception peak wavelength of the optical element 20. Otherwise, the configuration of the semiconductor device 113 is similar to that of the semiconductor device 110.

Figure 7:
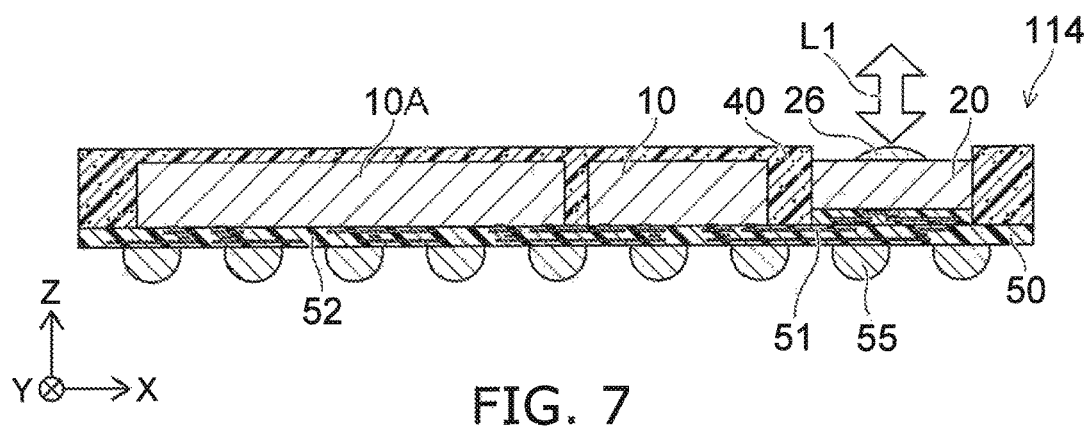
FIG. 7 is a schematic cross-sectional view illustrating another semiconductor device according to the first embodiment.

In a semiconductor device 114 as shown in FIG. 7, another electrical element 10A is provided in addition to the electrical element 10. The semiconductor device 114 further includes a lens 26. The optical element 20 is positioned between the lens 26 and the interconnect layer 50 in the first direction (the Z-axis direction). The input/output efficiency of a light L1 is increased by the lens.

In the example, the semiconductor device 114 further includes a first connector 55. For example, the first connector 55 is used to electrically connect to another device. For example, the interconnect layer 50 includes the conductive layer 51 that is electrically connected to the first connector 55. For example, the interconnect layer 50 is positioned in at least one of a position between the first connector 55 and the optical element 20 in the first direction (the Z-axis direction) and a position between the first connector 55 and the electrical element 10 in the first direction.

In a semiconductor device 115 as shown in FIG. 8, the optical element 20 has a recess 20h (e.g., a hole) provided in the first optical element surface 20a. For example, the end portion of an optical fiber or the like is inserted into the recess 20h. A low-loss optical connection is obtained.

The bottom surface of the recess 20h is 50 μm or less in the first direction (the Z-axis direction) from the second optical element surface 20b of the optical element 20. A stable optical connection is obtained.

The method for manufacturing the semiconductor device 115 further performs the formation of the recess 20h in the optical element 20.

In the semiconductor layers 110 to 115 as well, a semiconductor device can be provided in which downsizing is possible.

Another example of the method for manufacturing the semiconductor device will now be described.

FIGS. 9A to 9F, FIGS. 10A to 10E, and FIGS. 11A to 11E are schematic cross-sectional views illustrating another method for manufacturing the semiconductor device according to the second embodiment.

As shown in FIG. 9A, the wafer 20W that is used to form the optical element 20 is prepared. The wafer 20W includes, for example, the first optical element surface 20a, the second optical element surface 20b, and the recess 20h.

As shown in FIG. 9B, the bonding layer 28 is formed on the wafer 20W.

As shown in FIG. 9C, the first layer 27 is fixed to the wafer 20W by the bonding layer 28.

As shown in FIG. 9D, a portion of the first layer 27 may be removed. The removal of the portion of the first layer 27 is performed by, for example, polishing.

As shown in FIG. 9E, a second connector 56 is formed on the wafer 20W. A stacked body that includes the wafer 20W, the bonding layer 28, the first layer 27, and the second connector 56 is formed. At least a portion of the second connector 56 is electrically connected to the conductive layer included in the optical element 20.

As shown in FIG. 9F, the multiple first structure bodies SB1 are obtained by subdividing the stacked body recited above into multiple regions. In the example, the first structure body SB1 includes the optical element 20, the bonding layer 28, the first layer 27, and the second connector 56.

Figure 10A:
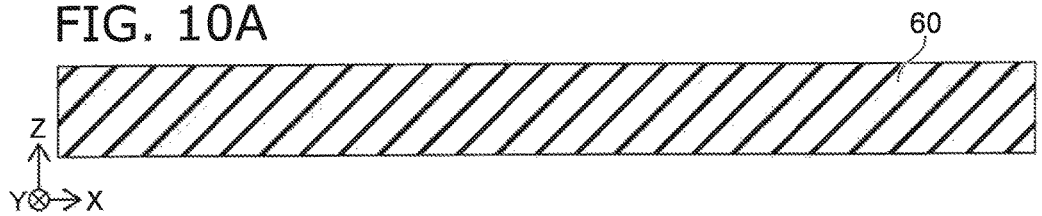
FIGS. 10A to 10E are schematic cross-sectional views illustrating another method for manufacturing the semiconductor device according to the second embodiment.

The support body 60 is prepared as shown in FIG. 10A.

Figure 10B:
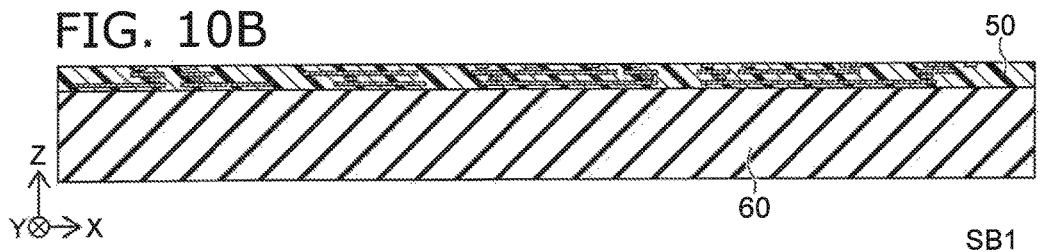

The interconnect layer 50 is formed on the support body 60 as shown in FIG. 10B.

Figure 10C:
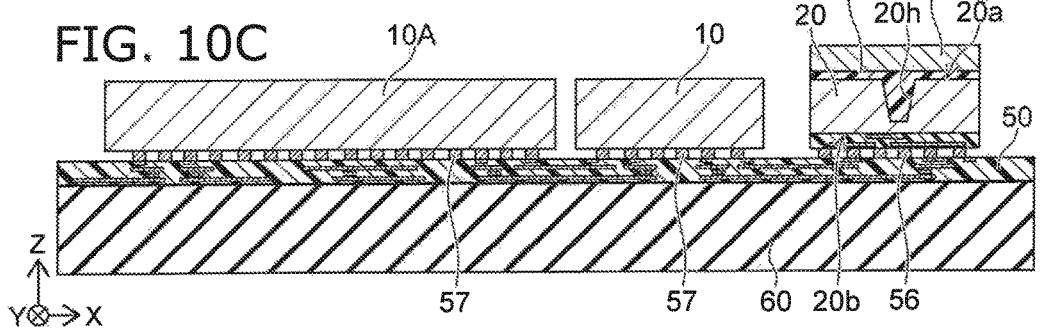

As shown in FIG. 10C, the first structure body SB1, the electrical element 10, and the other electrical element 10A recited above are fixed to the support body 60 on which the interconnect layer 50 is formed. For example, the second connector 56 may be electrically connected to at least a portion of the conductive layer included in the interconnect layer 50. For example, at least one of the electrodes (not illustrated) included in the electrical element 10 may be electrically connected by a third connector 57 to at least a portion of the conductive layer included in the interconnect layer 50.

Figure 10D:
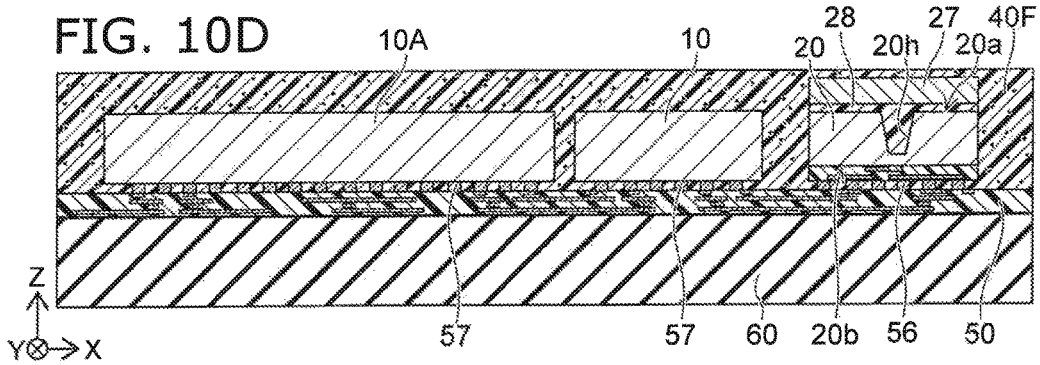

As shown in FIG. 10D, the first structure body SB1, the electrical element 10, and the other electrical element 10A are covered with the resin material layer 40F. The resin material layer 40F is used to form the resin portion 40.

Figure 10E:
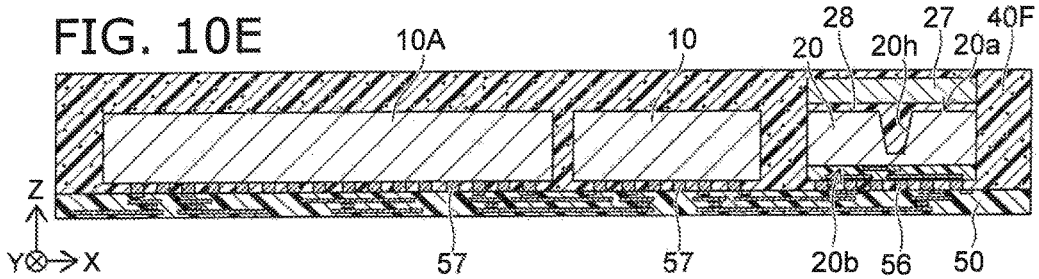

The support body 60 is removed as shown in FIG. 10E. The interconnect layer 50 is exposed.

As shown in FIG. 11A, the first layer 27 is exposed by removing a portion of the resin material layer 40F. In one example, the removal of the portion of the resin material layer 40F may be ended when the first layer 27 is exposed as shown in FIG. 11A. In one other example, the removal of the portion of the resin material layer 40F progresses further as shown in FIG. 11B; the first layer 27 also is removed; and the bonding layer 28 may be exposed.

As shown in FIG. 11A, in the case where the removal of the portion of the resin material layer 40F is ended when the first layer 27 is exposed, the first layer 27 is removed as shown in FIG. 11C.

The bonding layer 28 is removed as shown in FIG. 11D.

The first connector 55 is formed on the interconnect layer 50 as shown in FIG. 11E. Thereby, the semiconductor device is obtained.

Thus, in the example, the covering with the resin material layer 40F is performed in the state in which the first structure body SB1, the electrical element 10, and the other electrical element 10A are fixed to the support body 60 on which the interconnect layer 50 is formed. Then, after the covering with the resin material layer 40F, the interconnect layer 50 is exposed by removing the support body 60. The first layer 27 is exposed after the removal of the support body 60.

In yet another example of the method for manufacturing the semiconductor device according to the embodiment, the covering with the resin material layer 40F is performed in a state in which the first structure body SB1 and the electrical element 10 are fixed to the support body 60 on which the interconnect layer 50 is formed. Then, the first layer 27 is exposed after the covering with the resin material layer 40F. Then, after exposing the first layer 27, the interconnect layer 50 is exposed by removing the support body 60.

According to the embodiments, a semiconductor device and a method for manufacturing the semiconductor device can be provided in which downsizing is possible.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as interconnect layers, electrical elements, optical elements, resin portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   an interconnect layer;
   an electrical element, a direction from the interconnect layer toward the electrical element being a first direction;
   an optical element, a direction from the interconnect layer toward the optical element being aligned with the first direction, a second direction from the electrical element toward the optical element crossing the first direction; and
   a resin portion including a first partial region, the first partial region being between the electrical element and the optical element,
   at least a portion of the optical element not overlapping the resin portion in the first direction,
   the first partial region having a first resin portion surface and a second resin portion surface, the second resin portion surface being opposite to the first resin portion surface and opposing the interconnect layer,
the optical element having a first optical element surface and a second optical element surface, the second optical element surface being opposite to the first optical element surface and opposing the interconnect layer, the optical element including at least one of a light emitter or a light receiver, the at least one of the light emitter or the light receiver being provided at the second optical element surface,
a distance along the first direction between the interconnect layer and the first resin portion surface being longer than a distance along the first direction between the interconnect layer and the first optical element surface,
wherein the optical element includes:
an antireflective layer; and
a transparent layer provided between the antireflective layer and the interconnect layer, and
a refractive index of the antireflective layer is greater than 1 and lower than a refractive index of the transparent layer.

2. The device according to claim 1, wherein the optical element has a recess in the first optical element surface.

3. The device according to claim 2, wherein a bottom surface of the recess is 50 μm or less in the first direction from the second optical element surface of the optical element.

4. The device according to claim 1, further comprising a lens,
the second optical element surface of the optical element being positioned between the lens and the interconnect layer in the first direction.

5. The device according to claim 1, wherein the electrical element is positioned between the interconnect layer and a portion of the resin portion in the first direction.

6. The device according to claim 1, wherein
the resin portion further includes second to seventh partial regions,
the optical element is positioned between the second partial region and the first partial region in the second direction,
the electrical element is positioned between the first partial region and the third partial region in the second direction,
the optical element is positioned between the fourth partial region and the fifth partial region in a third direction, the third direction crossing a plane including the first direction and the second direction, and
the electrical element is positioned between the sixth partial region and the seventh partial region in the third direction.

7. The device according to claim 1, wherein the resin portion includes:
a plurality of particles; and
a resin material portion provided around at least a portion of the plurality of particles.

8. The device according to claim 1, wherein the interconnect layer includes a conductive layer electrically connecting the optical element and the electrical element.

9. The device according to claim 1, further comprising a first connector,
the interconnect layer including a conductive layer electrically connected to the first connector,
the interconnect layer being positioned in at least one of a position between the first connector and the optical element in the first direction or a position between the first connector and the electrical element in the first direction.

10. The device according to claim 1, wherein the electrical element includes at least one of an amplifier circuit, a logic circuit, a memory circuit, or a switching circuit.

11. The device according to claim 1, wherein the optical element includes at least one of a light-emitting element, an optical modulator, or a light receiving element.

12. A semiconductor device, comprising:
an interconnect layer;
an electrical element, a direction from the interconnect layer toward the electrical element being a first direction;
an optical element, a direction from the interconnect layer toward the optical element being aligned with the first direction, a second direction from the electrical element toward the optical element crossing the first direction; and
a resin portion including a first partial region, the first partial region being between the electrical element and the optical element,
at least a portion of the optical element not overlapping the resin portion in the first direction,
the first partial region having a first resin portion surface and a second resin portion surface, the second resin portion surface being opposite to the first resin portion surface and opposing the interconnect layer,
the optical element having a first optical element surface and a second optical element surface, the second optical element surface being opposite to the first optical element surface and opposing the interconnect layer, the optical element including at least one of a light emitter or a light receiver, the at least one of the light emitter or the light receiver being provided at the second optical element surface,
a distance along the first direction between the interconnect layer and the first resin portion surface being longer than a distance along the first direction between the interconnect layer and the first optical element surface,
wherein
the optical element includes:
an antireflective layer; and
a transparent layer provided between the antireflective layer and the interconnect layer, and,
the optical element is configured to emit light and a refractive index of the antireflective layer for a peak wavelength of the light is greater than 1 and lower than a refractive index of the transparent layer for the peak wavelength, or
the optical element is configured to absorb light and a refractive index of the antireflective layer for a peak wavelength of the light absorbed by the optical element is greater than 1 and lower than a refractive index of the transparent layer for the peak wavelength.

13. The device according to claim 12, wherein the electrical element is positioned between the interconnect layer and a portion of the resin portion in the first direction.

14. The device according to claim 12, wherein
the resin portion further includes second to seventh partial regions,
the optical element is positioned between the second partial region and the first partial region in the second direction, the electrical element is positioned between the first partial region and the third partial region in the second direction, the optical element is positioned between the fourth partial region and the fifth partial region in a third direction, the third direction crossing a plane including the first direction and the second direction, and the electrical element is positioned between the sixth partial region and the seventh partial region in the third direction.

15. The device according to claim 12, wherein the resin portion includes:
a plurality of particles; and
a resin material portion provided around at least a portion of the plurality of particles.

16. The device according to claim 12, wherein the interconnect layer includes a conductive layer electrically connecting the optical element and the electrical element.

17. A semiconductor device, comprising:
an interconnect layer;
an electrical element, a direction from the interconnect layer toward the electrical element being a first direction;
an optical element, a direction from the interconnect layer toward the optical element being aligned with the first direction, a second direction from the electrical element toward the optical element crossing the first direction; and
a resin portion including a first partial region, the first partial region being between the electrical element and the optical element,
at least a portion of the optical element not overlapping the resin portion in the first direction,
the first partial region having a first resin portion surface and a second resin portion surface, the second resin portion surface being opposite to the first resin portion surface and opposing the interconnect layer,
the optical element having a first optical element surface and a second optical element surface, the second optical element surface being opposite to the first optical element surface and opposing the interconnect layer,
the optical element including at least one of a light emitter or a light receiver, the at least one of the light emitter or the light receiver being provided at the second optical element surface,
a distance along the first direction between the interconnect layer and the first resin portion surface being longer than a distance along the first direction between the interconnect layer and the first optical element surface,
wherein
the first optical element surface includes a plurality of unevennesses, and
the plurality of unevennesses is arranged at a period shorter than a light emission peak wavelength or a light reception peak wavelength of the optical element, or the plurality of unevennesses is a diffractive lens or a Fresnel lens for a light emission peak wavelength or a light reception peak wavelength of the optical element.

\* \* \* \* \*